(12) United States Patent
Canfield et al.

(10) Patent No.: US 8,424,594 B2
(45) Date of Patent: Apr. 23, 2013

(54) APPARATUS FOR THERMAL CONTROL IN THE ANALYSIS OF ELECTRONIC DEVICES

(75) Inventors: Daniel C. Canfield, McMinnville, OR (US); John Joseph Harsany, Tualatin, OR (US); Frank Sauk, San Ramon, CA (US); William Joseph Yost, III, Newton, MA (US)

(73) Assignee: Presto Engineering, Inc., San Jose, CA (US)

( * ) Notice: Subject to any disclaimer, the term of this patent is extended or adjusted under 35 U.S.C. 154(b) by 948 days.

(21) Appl. No.: 11/953,630

(22) Filed: Dec. 10, 2007

(65) Prior Publication Data

US 2009/0146055 A1   Jun. 11, 2009

(51) Int. Cl.
 *F28F 7/00* (2006.01)
 *G01R 31/00* (2006.01)

(52) U.S. Cl.
 USPC ............. 165/185; 165/80.1; 324/750.03; 324/750.09

(58) Field of Classification Search ........... 324/750.01, 324/750.03, 750.04, 750.05, 750.09; 165/185, 165/80.1
 See application file for complete search history.

(56) References Cited

U.S. PATENT DOCUMENTS

| | | | | |
|---|---|---|---|---|
| 2,787,935 | A * | 4/1957 | Inoue | 353/122 |
| 3,065,670 | A * | 11/1962 | Becker | 359/724 |
| 4,266,191 | A * | 5/1981 | Spano et al. | 324/750.23 |
| 4,962,355 | A * | 10/1990 | Holderfield et al. | 324/750.03 |
| 5,004,307 | A * | 4/1991 | Kino et al. | 359/356 |
| 5,307,977 | A | 5/1994 | Park | |
| 5,747,994 | A * | 5/1998 | Suga | 324/750.01 |
| 5,894,220 | A * | 4/1999 | Wellstood et al. | 324/248 |
| 5,895,972 | A * | 4/1999 | Paniccia | 257/706 |
| 6,140,141 | A * | 10/2000 | Davidson | 438/16 |
| 6,229,702 | B1 * | 5/2001 | Tao et al. | 361/704 |
| 6,256,841 | B1 | 7/2001 | Ericson | |
| 6,270,696 | B1 * | 8/2001 | Jain et al. | 264/1.1 |
| 6,369,957 | B1 * | 4/2002 | Ishida | 359/719 |
| 6,621,275 | B2 * | 9/2003 | Cotton et al. | 324/537 |
| 6,668,570 | B2 * | 12/2003 | Wall et al. | 62/223 |
| 6,867,288 | B1 | 3/2005 | Klinger et al. | |
| 6,988,543 | B2 * | 1/2006 | Walczak | 165/168 |
| 7,956,625 | B1 * | 6/2011 | Portune | 324/750.09 |
| 2002/0145439 | A1 * | 10/2002 | Gaasch et al. | 324/760 |
| 2004/0070070 | A1 * | 4/2004 | Sung | 257/706 |
| 2004/0070415 | A1 * | 4/2004 | Schneidewind et al. | 324/760 |
| 2004/0239353 | A1 * | 12/2004 | Gudin et al. | 324/758 |
| 2005/0275419 | A1 * | 12/2005 | Cader et al. | 324/760 |
| 2006/0169897 | A1 * | 8/2006 | Andrews et al. | 250/310 |
| 2007/0046947 | A1 * | 3/2007 | Lo et al. | 356/492 |
| 2007/0075724 | A1 * | 4/2007 | Rumbaugh | 324/765 |
| 2007/0205795 | A1 * | 9/2007 | Pakdaman et al. | 324/765 |

* cited by examiner

*Primary Examiner* — Allen Flanigan
*Assistant Examiner* — Jason Thompson
(74) *Attorney, Agent, or Firm* — Trojan Law Offices

(57) ABSTRACT

A heat spreader comprising a sheet of transparent diamond with an aperture therein that accommodates a solid-immersion lens (SIL). The heat spreader may be mounted within a clamp which allows the heat spreader to move freely across the Device Under Test (DUT) while maintaining a very high degree of planarity and contact between the diamond and the silicon substrate of the DUT. The DUT is secured to its electrical interface with a low profile clamp, the DUT may be held within the clamp by a mechanism that applies a pressure to the sides of the DUT package.

17 Claims, 5 Drawing Sheets

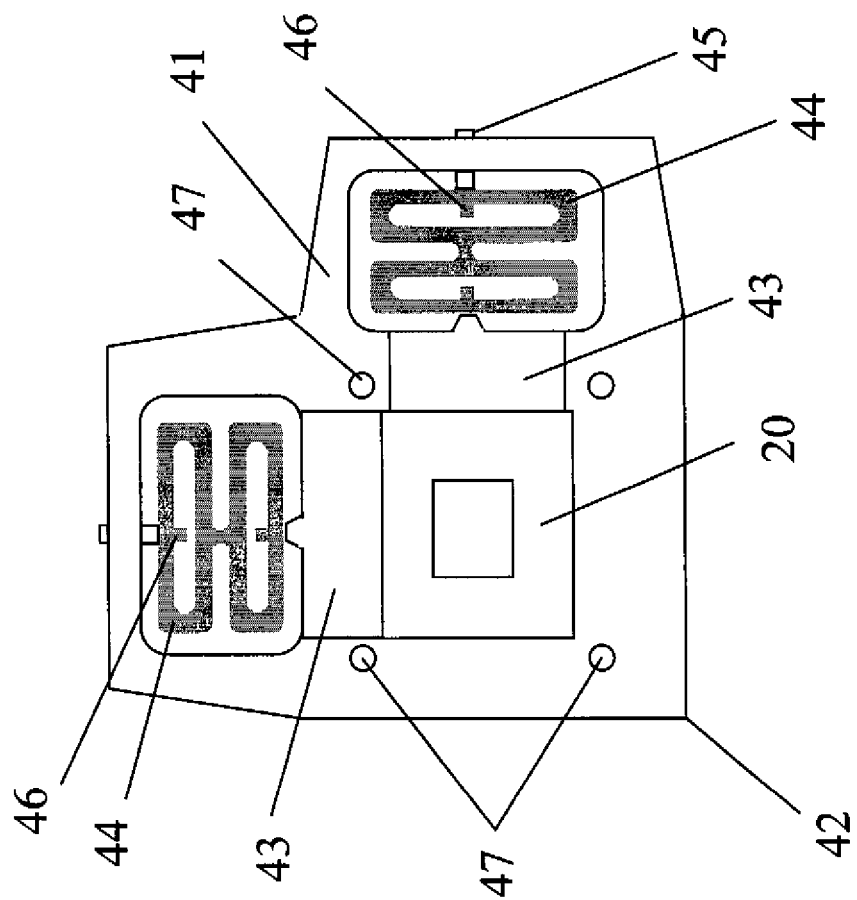

APPARATUS FOR THERMAL CONTROL IN THE ANALYSIS OF ELECTRONIC DEVICES

FIELD OF THE INVENTION

The present invention relates to methods and apparatus for inspecting and analysing electronic devices such as microprocessors.

BACKGROUND TO THE INVENTION

One known method for inspecting and analysing electronic devices such as flip-chip packaged microprocessors involves optical or infrared probing of the electronic device. During probing, a device which includes a silicon substrate: the device under test (DUT), is powered normally and its response is measured through the back of the silicon substrate by analysing the phase shift in a laser probe. For example, a modulated 1.064 µm laser probe may be used. The laser illuminates the device through an air-gap lens or a solid-immersion-lens (SIL) and the reflected beam is collected through the same lens. As the DUT is under power, it generates a large amount of heat and needs to be actively cooled to maintain its temperature and prevent it from entering thermal runaway.

In another known method, photon emission during switching is monitored. Such a method requires that the thermal conditions during the analysis are stable and reproducible in different locations. Consequently, active cooling is also required in such a test method.

Current state of the art inspection tools either use a fixed diamond heat spreader to remove heat from the device, or use liquid, such as water, sprayed on to the silicon substrate of the device to remove the heat from the device. U.S. Pat. No. 6,836,131 discloses an apparatus for spray cooling.

For example, "Transparent Heat Spreader for Backside Optical Analysis of High Power Microprocessors", Proceedings of the 26$^{th}$ International Symposium for Testing and Failure Analysis (2000), pp. 547-551, to T. M. Eiles, et al., discloses a transparent heat spreader formed from a polycrystalline diamond window which is placed in contact with the die of the DUT. The DUT is viewed through the heat spreader which remains stationary relative to the DUT. Any point on the die surface of the device can be viewed through the heat spreader. U.S. Pat. No. 5,895,972 discloses an apparatus for contacting a DUT with a stationary light-transparent heat spreader. U.S. Pat. No. 6,760,223 discloses an apparatus for contacting a DUT with a stationary light-transparent heat spreader and maintaining a constant pressure.

Viewing through a diamond window is ideal for high power dissipation during optical imaging of operating semiconductors. However, viewing through the diamond heat spreader with a SIL causes a substantial loss of image quality and significantly reduces the improvement in numerical aperture (NA). Such a heat spreader can be used satisfactorily to analyse a 90 nm feature on a DUT but is incompatible with the optical characteristics of SILs required to resolve features on DUTs which have a higher resolution, e.g. features of 65 nm and below that are currently being developed. Such SILs must touch the silicon substrate of the DUT to achieve the required image resolution.

The use of a high pressure liquid to spray cool the device has limited thermal conductivity, especially near a SIL. In addition, the method does not permit wide area imaging because the turbulent liquid present in the light path impairs the image quality acquired using air-gap lenses.

Consequently, an improved apparatus for analysing semiconductor devices is required.

SUMMARY OF THE INVENTION

The present invention provides a heat spreader comprising a sheet of transparent diamond having a first surface and a second surface and an aperture formed between the first surface and the second surface.

The diamond sheet is preferably chemical vapour deposition (CVD) diamond, and more preferably polycrystalline (PC) CVD diamond. The diamond sheet preferably has a thickness of between 300 µm and 1 mm, and most preferably a thickness of 500 µm.

The thermal conductivity of the diamond sheet is preferably greater than 1000 W/mK, more preferably greater than 1500 W/mK, more preferably greater than 1800 W/mK, and most preferably approximately 2200 W/mK.

The transmission of the diamond sheet is preferably greater than 70% at 10.6 microns and greater than or equal to 65% at 1.06 microns, and transmissive at 257 nm.

The aperture is shaped and sized to accommodate a SIL. A SIL is typically 1-4 mm in cross section diameter, with a conical or hemispherical shape. Consequently, the aperture may have a cross section diameter of approximately 1-4 mm, with a conical or hemispherical shape.

In order to improve optical access to the SIL, the aperture in the diamond may be conical such that the area of the cross-section at the first surface is larger than the area of the cross-section at the second surface. The walls of the aperture are preferably optical quality to allow imaging through the walls. By providing a conical aperture, SILs of various diameters could be used with the same diamond heat spreader.

The diamond heat spreader may be mounted within a heatsink. The heatsink may have a cooling ring. The cooling ring may comprise a copper plate. The copper plate may be plated with gold to prevent corrosion. The diamond sheet may be attached to the cooling ring with Indium solder. The cooling ring may be air or fluid-cooled and may include a base having a plurality of cooling fins and a cover. The coolant may be dry air or fluid in order to reduce the amount of condensation forming on the cooling ring. The base of the cooling ring may be separated from the cover by an insulating ring. Preferably, no cooling fins are provided on the cover in order to reduce the amount of condensation forming on the cover. The insulating ring is preferably of comparable size to the base and preferably formed of Teflon. The provision of such an insulating ring reduces the amount of condensation that forms on the cooling ring without impacting cooling performance.

For input air at −50° C., a DUT at 0° C. and a device input power of 100 W, the thermal resistance of a heat spreader is 0.5° C./W. Preferably the thermal performance of the heat spreader as a whole is in the range 0.4 to 0.6° C./W. Consequently, a 600 W device could be cooled using commonly available air cooling systems.

In use, the heat spreader is placed with its second surface in contact with the silicon substrate of a DUT so that the highly effective cooling properties of the diamond heat spreader are employed to cool the DUT. In order to maximise the resolution of the analysis, a SIL can be placed in the aperture in the diamond heat spreader so that the SIL is in direct contact with the silicon substrate of the DUT. Preferably the profile of the aperture matches that of the SIL in order to minimise heat build up.

The diamond heat spreader may be forced against the silicon substrate of the DUT with a uniform pressure. The SIL may also be forced against the silicon substrate of the DUT with a uniform pressure, although the pressure on the SIL may be controlled separately to that on the diamond heat spreader.

The heat spreader may be movable relative to the DUT in a direction parallel to the surface of the silicon substrate of the DUT, so that any point on the silicon substrate of the DUT can be analysed at a high resolution with the SIL positioned in direct contact with the silicon substrate of the DUT.

In order to maintain a uniform pressure on the silicon substrate of the DUT and move the heat spreader relative to the DUT, the heat spreader may be mounted within a clamp which allows the heat spreader to move freely across the DUT whilst maintaining a very high degree of planarity and contact between the diamond and the silicon substrate of the DUT.

The clamp may comprise a frame having rails in an X-direction and a Y-direction which is perpendicular to the X-direction. The X- and Y-directions may be parallel to the surface of the silicon substrate of the DUT. The heat spreader may be mounted to slide on the rails. Consequently, the heat spreader can be positioned at any position within the frame in the X-Y plane. The frame may be provided with one or more springs for applying pressure to the heat spreader in a direction towards the DUT. The springs allow the heat spreader to be forced toward the DUT with a constant force without restricting its movement in the X-Y plane.

The heat spreader and SIL may be movable together.

Since the diamond heat spreader may be moved with the SIL, it is not necessary for the diamond sheet to cover the whole silicon substrate of DUT. Consequently, the size of the diamond can be reduced relative to known prior art devices, and the cooling ring can be brought closer to the SIL and the DUT.

The SIL lens could be movable out of the aperture, and an air gap lens could be provided which could be used to analyse a larger area of the DUT at a lower resolution, through the diamond heat spreader. In such a case, the diamond heat spreader may be large enough to cover a portion of the silicon substrate of the DUT or the whole of the silicon substrate of the DUT.

Consequently, the arrangement of the present invention can be used in conjunction with both air-gap and SIL lenses. Therefore, both global-imaging and pin-point measurements can be achieved using the same heat spreader by taking advantage of both the optical transparency and thermal conductivity characteristics of diamond.

Index matching fluid may be provided between the diamond and the silicon substrate of the DUT to eliminate reflection losses associated with light passing through the interface between dissimilar materials. In addition it is used in this invention to minimise friction between the diamond and the silicon substrate of the DUT and to improve the thermal contact and heat transfer. The index matching fluid may be sufficiently displaced from under the SIL to avoid affecting its optical performance.

In order to improve cooling of the SIL through the diamond, the SIL may be in intimate contact with the diamond heat spreader, and/or index matching fluid may be provided between the diamond and the SIL.

Analysis of the DUT is performed by connecting the DUT to a socket which allows for easy insertion and removal of the DUT. Such sockets use spring probes. Although the force required to connect each probe is low, the number of probes is very high (up to several thousand). Therefore, assuming the maximum compression force is 250 lbs, the DUT must be pushed downwards onto the socket with 250 lbs of downward force. This is generally achieved by holding the DUT in a clamp which pushes down on an upper surface of the DUT package.

Accordingly, the present invention also provides a clamp for a DUT which overcomes this problem. The clamp has a very low profile which enables the heat spreader to move over a large area without colliding with the clamp in which the DUT is mounted. In particular, the clamp is provided so that its uppermost surface is flush with the DUT package surface. Typically silicon substrates are thinned to 100 μm for such analysis. Consequently the silicon substrate surface is positioned about 100 μm above the DUT package surface and, about 100 μm above the uppermost surface of the clamp.

In order to secure the DUT to its electrical interface with a low profile clamp, the DUT may be held within the clamp by a mechanism that applies a pressure to the sides of the DUT package. In particular, the DUT clamp comprises a frame having a first surface and a second surface parallel to the first surface, and an aperture formed between the first surface and the second surface for housing a device under test; a first jaw and a second jaw; a first spring positioned to bias the first jaw in a first direction towards the aperture for housing the device under test; and a second spring positioned to bias the second jaw in a second direction towards the aperture for housing the device under test; wherein the first direction is perpendicular to and coplanar with the second direction and parallel to the first and second surfaces.

Each spring forces each jaw against the DUT package, and each jaw forces the DUT package against a surface of the frame. Preferably no part of the first or second jaw, or the first or second spring extends above the first surface of the frame. The spring force of each of the first and second springs may be adjusted using a set screw. The spring force of each of the first and second springs may be limited by limit posts provided on the springs. At least two protrusions may be provided on the first surface of the clamp frame. Such protrusions ensure that the heat spreader is maintained at a constant distance from the DUT package across the whole silicon substrate. The protrusions may extend the same distance above the first surface of the DUT clamp as the thickness of the silicon substrate of the DUT to ensure a contact force planarity between the heat spreader and the silicon substrate of the DUT.

Both the clamp frame and the clamp jaws may be formed from stainless steel. The springs may be formed from beryllium copper which has a lower stiffness than stainless steel and consequently provides more control and feedback for the user mounting the DUT. The surfaces of the frame and jaws that are in contact with the DUT package are treated with a bead blast finish or coated with rubber to increase their coefficient of friction.

If the number of spring probes is n and the force of each spring probe is $F_s$, then the total downward force required is $F_s n$. Assuming the finish given to the stainless steel jaws and housing raises the coefficient of friction against the socket to $\mu_s$, this means that the jaws must provide a total sideward force of $F_s n/\mu_s$ to resist movement from the spring probes. For example, if the maximum downward force, $F_s n$, required is 250 lbs, the DUT clamp must provide 250 lbs of downward force by clamping sideways to maintain the DUT within the clamp. If the finish given to the stainless steel jaws and housing raises the coefficient of friction, $\mu_s$, against the DUT to 0.4, the jaws must provide a total sideward force of 625 lbs to resist movement from the spring probes.

The DUT clamp controls the clamping force, maintains a very low profile and takes up a minimum amount of electrical interface area.

BRIEF DESCRIPTION OF THE DRAWINGS

The patent or application file contains at least one drawing executed in color. Copies of this patent or patent application publication with color drawing(s) will be provided by the Office upon request and payment of the necessary fees. Embodiments of the present invention will now be described with reference to the following drawing, in which:

FIG. 6 shows a top view of the DUT clamp with the DUT in place.

DETAILED DESCRIPTION OF THE INVENTION

Figure 1:
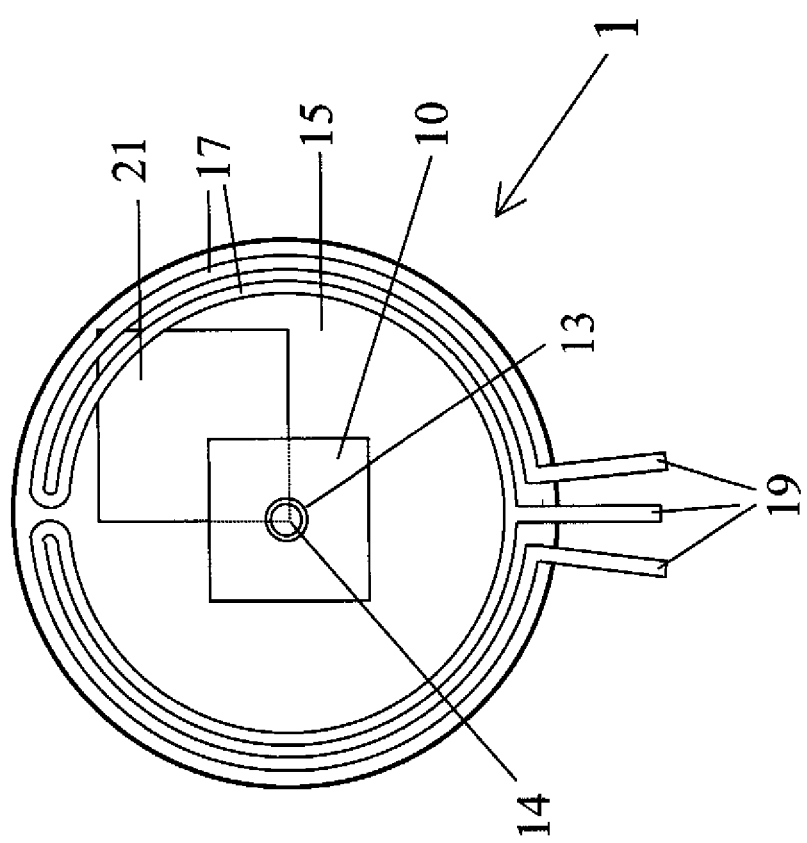
FIG. 1 shows a schematic top view of a heat spreader according to the present invention.
Figure 2:
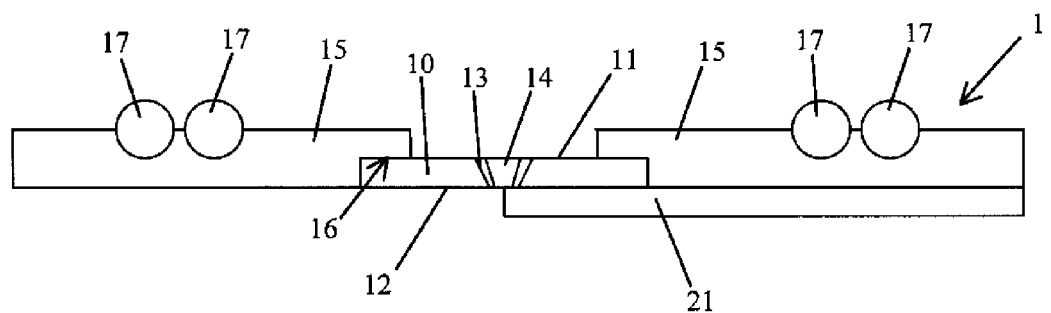
FIG. 2 shows a cross-sectional view of the heat spreader of FIG. 1.
Figure 3:
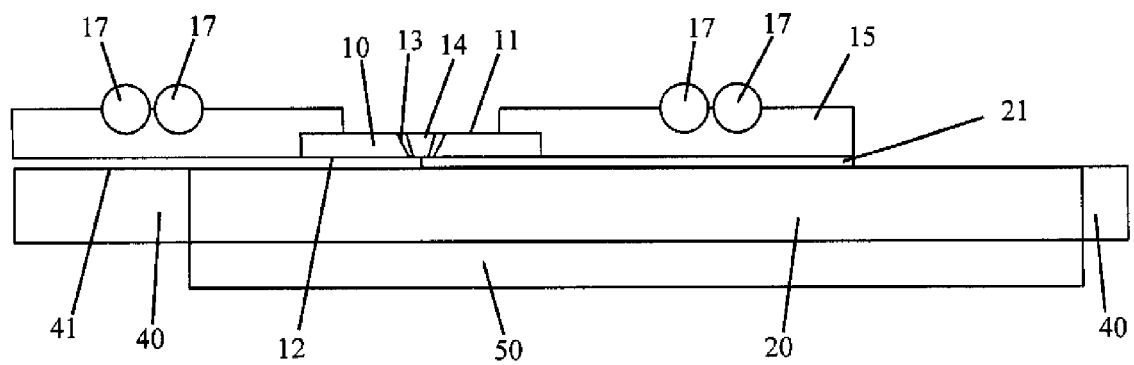
FIG. 3 shows a cross section view of the heat spreader of FIG. 1 when positioned in contact with a silicon substrate of a DUT.

FIGS. 1 to 3 show a heat spreader 1 according to the present invention. The heat spreader 1 includes a sheet 10 of transparent diamond having a first surface 11 and a second surface 12 and an aperture 13 formed between the first surface 11 and the second surface 12. The diamond sheet 10 preferably has a thickness of 500 µm.

The aperture 13 is shaped and sized to accommodate a SIL 14. The SIL 14 typically has a diameter of 1-4 mm. Consequently, the aperture 13 typically has a diameter of approximately 1-4 mm.

In order to improve optical access to the SIL, the aperture 13 in the diamond sheet 10 is conical such that the area of the cross-section of the aperture 13 at the first surface 11 is larger than the area of the cross-section of the aperture 13 at the second surface 12. The walls of the aperture 13 are smooth in order to improve imaging through the diamond 10. The provision of the conical aperture 13 allows the same heat spreader to be used with SILs of different diameters.

Figure 4:
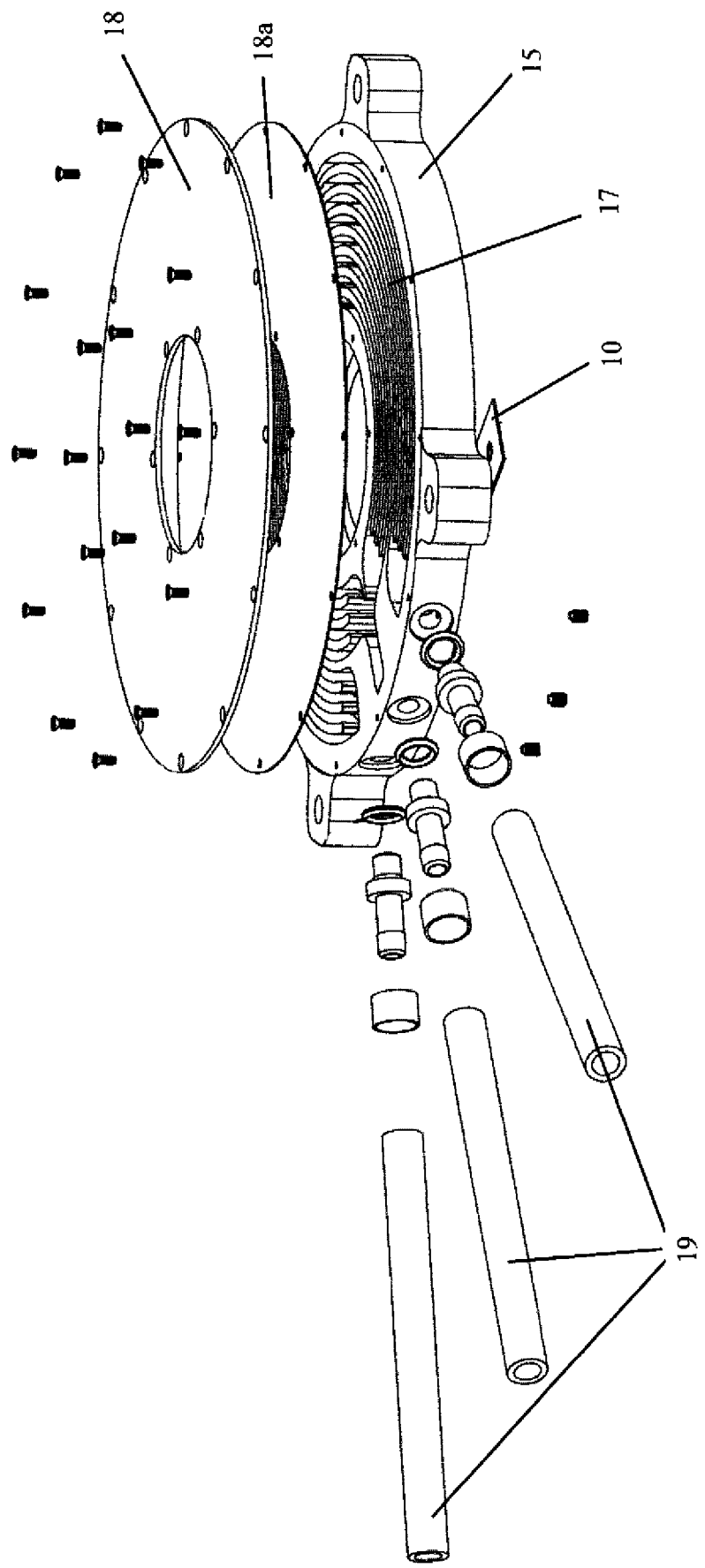
FIG. 4 shows a perspective exploded view of a heat spreader according to the present invention.

The diamond sheet 10 is mounted within a heatsink comprising a cooling ring. The diamond sheet 10 is attached to the cooling ring with Indium solder in the area marked by arrow 16 in FIG. 2. The cooling ring is air-cooled and includes a base 15 formed from copper plated with gold to prevent corrosion. The cooling ring includes a plurality of air channels and a cover 18 shown in FIG. 4. The air channels 17 are connected to an air source via inlet and outlet cooling hoses 19. The base 15 of the cooling ring is separated from the cover 18 by an insulating ring 18a. No cooling fins are provided on the cover 18 in order to reduce condensation forming on the cover 18. The insulating ring is the same size as the base and preferably formed of Teflon. The provision of such an insulating ring reduces the amount of condensation that forms on the cooling ring without impacting cooling performance.

In use, the heat spreader 1 is placed with its second surface 12 in contact with a silicon substrate 21 of the DUT 20 so that the highly effective cooling properties of the diamond heat spreader 1 are employed to cool the DUT 20. In order to maximise the resolution of the analysis, a SIL 14 is placed in the aperture 13 in the diamond sheet 10 so that the SIL 14 is in direct contact with the silicon substrate 21 of the DUT 20. The profile of the aperture 13 matches that of the SIL 14 in order to minimise heat build up.

The diamond heat spreader 1 is forced against the silicon substrate 21 of the DUT 20 with a uniform pressure. The SIL 14 is also forced against the silicon substrate 21 of the DUT 20 with a uniform pressure. The pressure on the SIL 14 is controlled separately to that on the diamond heat spreader 1.

The heat spreader 1 is movable relative to the DUT 20 in a direction parallel to the surface of the silicon substrate 21 of the DUT 20, so that any point on the silicon substrate 21 of the DUT 20 can be analysed at a high resolution with the SIL 14 positioned in direct contact with the silicon substrate 21 of the DUT 20.

Figure 5:
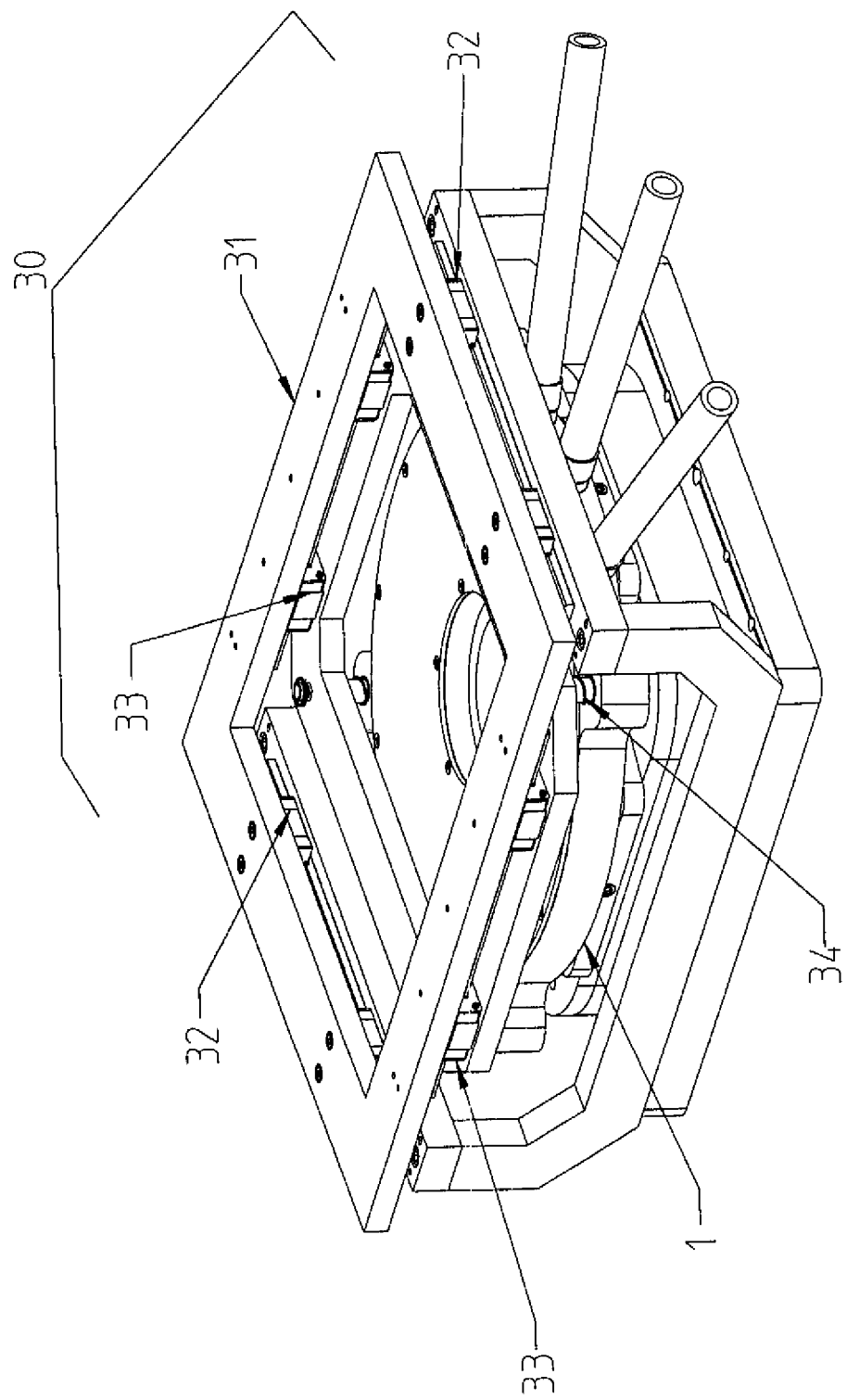
FIG. 5 shows a perspective view of the clamp and frame.

As can be seen from FIG. 5, the heat spreader 1 is mounted within a clamp 30 in order to maintain a uniform pressure on the silicon substrate 21 of the DUT 20 and move the heat spreader 1 relative to the DUT 20. The clamp 30 allows the heat spreader to move freely across the DUT 20 whilst maintaining a very high degree of planarity and contact between the diamond sheet 10 and the silicon substrate 21 of the DUT 20.

The clamp 30 comprises a frame 31 having rails 32, 33 in an X-direction and a Y-direction which is perpendicular to the X-direction. The X- and Y-directions are parallel to a surface of the silicon substrate 21 of the DUT 20. The heat spreader 1 is mounted to slide on the rails 32, 33. Consequently, the heat spreader 1 can be positioned at any position within the frame 31 in the X-Y plane. The clamp also includes a plurality of springs 34 for pushing the heat spreader 1 towards the DUT 20. The springs 34 allow the heat spreader 1 to be forced toward the DUT 20 with a constant force without restricting its movement in the X-Y plane.

The heat spreader 1 and SIL 14 can be moved together.

Since the heat spreader 1 can be moved with the SIL 14, it is not necessary for the diamond sheet 10 to cover the whole of the silicon substrate 21 of the DUT 20. Consequently, the size of the diamond sheet 10 is smaller than that used in known prior art devices, and the cooling ring 15 can be brought closer to the SIL 14 and the DUT 20. The SIL lens 14 is movable out of the aperture 13, and an air gap lens (not shown) could be provided which could be used to analyse a larger area of the DUT 20 at a lower resolution, through the transparent diamond sheet 10. In such a case, the diamond sheet may be large enough to cover just a portion of the silicon substrate 21 of the DUT 20 or, alternatively, the whole of the silicon substrate 21 of the DUT 20. A preferred design is to provide imaging for the largest field of view of all lenses installed on the inspection tool.

Since the arrangement of the present invention can be used in conjunction with both air-gap and SIL lenses, both global-imaging and pin-point measurements can be achieved using the same heat spreader.

Index matching fluid (not shown) is provided between the heat spreader 1 and the silicon substrate 21 of the DUT 20 to minimise friction between the heat spreader 1 and the silicon substrate 21 of the DUT 20 and to improve the thermal contact and heat transfer. The index matching fluid is sufficiently displaced from under the SIL 14 to avoid affecting the optical performance of the SIL.

In order to improve cooling of the SIL 14 through the diamond sheet 10, the SIL 14 is positioned in intimate contact with the diamond heat spreader, and index matching fluid is provided between the diamond sheet 10 and the SIL 14.

The DUT 20 is held within a clamp 40. The clamp 40 has a very low profile which enables the heat spreader 1 to move over a large area without colliding with the clamp 40 in which the DUT 20 is mounted. In particular, the uppermost surface 41 of the clamp 40 is flush with the back surface of the package of the DUT. Typically the silicon substrate is positioned about 100 µm above the DUT package surface and consequently, about 100 µm above the uppermost surface 41 of the clamp 40.

In order to secure the DUT 20 to its electrical interface with a low profile clamp 40, the DUT 20 is held within the clamp by a mechanism that applies a pressure to the sides of the DUT package 20. In particular, the DUT clamp 40 comprises a frame 42 in which is mounted a pair of jaws 43. Each jaw 43 is forced against the DUT package 20 by a spring 44. The first jaw 43 is forced by the first spring 44 in a first direction and the second jaw 43 is forced by the second spring 44 in a second direction which is coplanar with and perpendicular to the first direction. Each of the first jaw 43 and the second jaw 43 forces the DUT package 20 against a vertical surface of the frame 42. The spring force of each of the first and second springs 44 is adjustable using a set screw 45. The spring force of each of the first and second springs 44 is limited by limit posts 46 provided on the springs 44. Protrusions 47 are provided on the uppermost surface 41 of the clamp housing 42. These protrusions 47 ensure that the heat spreader 1 is maintained at a constant distance from the DUT package across the whole silicon substrate 21. The protrusions 47 extend 100 µm above the uppermost surface 41 of the DUT clamp 40, i.e. the same distance as the thickness of the silicon substrate 21, to ensure a contact force planarity between the heat spreader 1 and the silicon substrate 21 of the DUT 20.

Both the clamp frame 42 and the clamp jaws 43 are manufactured from stainless steel. The springs 44 are manufactured from beryllium copper which has a lower stiffness than stainless steel and consequently provides more control and feedback to the user. The surfaces of the frame 42 and jaws 43 that are in contact with the DUT package 20 are treated with a bead blast finish or coated with rubber to increase their coefficient of friction.

Analysis of the DUT 20 is performed by connecting the DUT 20 to a socket 50 which allows for easy insertion and removal of the DUT 20. Such sockets 50 use spring probes. If the maximum compression force required is 250 lbs, the DUT clamp 40 must provide 250 lbs of downward force by clamping sideways to maintain the DUT 20 within the clamp 40 when it is connected to the socket 50. If the finish given to the stainless steel jaws and housing raises the coefficient of friction ($\mu_s$) against the socket to 0.4, this means that the jaws must provide a total sideward force of 625 lbs to resist movement from the spring probes.

The DUT clamp 40 controls the clamping force, maintains a very low profile and takes up a minimum amount of electrical interface area.

It will of course be understood that the present invention has been described above purely by way of example, and that modifications of detail can be made within the scope of the invention as defined by the claims.

The invention claimed is:

1. A testing apparatus comprising: a device under test (DUT), said DUT having a first surface, a second surface, and a plurality of sides perpendicular to said first surface and said second surface, comprising;
   a frame, said frame having a first rail for translation in a first lateral direction and a second rail for translation in a second lateral direction that is perpendicular and coplanar to said first lateral direction;
   a heat spreader mounted to said first rail and said second rail, said heat spreader including a transparent diamond sheet having a first surface and a second surface with a single aperture formed therein;
   said diamond sheet mounted in a cooling ring that includes a base formed from copper plated with gold;
   a solid immersion lens accommodated in said aperture of said transparent diamond sheet;
   a clamp for holding said DUT under said heat spreader;
      said clamp having a first spring for biasing a first jaw to a first side of said DUT, a second spring for biasing a second jaw to a second side of said DUT, and an uppermost surface that is flush with said first surface of said DUT such that said heat s reader is ca s able of moving over said DUT without colliding with said clamp;
   wherein said DUT is held under said heat spreader by said clamp such that said heat spreader is pressed against a silicon substrate located above said first surface of said DUT by at least one spring to maintain uniform pressure on said DUT while said second surface of said DUT is secured to an electrical interface with said clamp; and
   wherein said heat spreader is movable relative to said DUT by translation of said rails in said lateral directions to position said solid immersion lens for analyzing said DUT while said heat spreader remains in contact with said DUT.

2. The heat spreader of claim 1 wherein the diamond sheet has a thickness of between 300 µm and 1 mm.

3. The heat spreader of claim 1 wherein the aperture has a diameter in the range of 1-4 mm.

4. The heat spreader of claim 1, wherein the aperture in the diamond sheet is conical such that the area of the cross-section of the aperture at the first surface is larger than the area of the cross-section of the aperture at the second surface.

5. The heat spreader of claim 1 wherein the diamond sheet is attached to the cooling ring with Indium solder.

6. The heat spreader of claim 1, wherein the cooling ring includes:
   a base having a plurality of cooling fins;
   a cover; and
   an insulating ring positioned between the base and the cover.

7. The apparatus of claim 1 wherein the profile of the aperture matches that of the solid immersion lens.

8. The apparatus of claim 7, further comprising:
   means for forcing the diamond sheet against the device under test with a uniform pressure.

9. The apparatus of claim 1 and further comprising index matching fluid between the device under test and the diamond sheet.

10. The apparatus of claim 9 and further comprising a socket for connection with a device under test.

11. The clamp of claim 1 wherein no part of the first or second jaw, or the first or second spring, extends above an upper surface of the frame.

12. The clamp of claim 11 further comprising a set screw for adjusting the spring force of the first spring.

13. The clamp of claim 11 wherein the first spring includes at least one limit post for limiting the spring force of the first spring.

14. The clamp of claim 11 further comprising at least two protrusions provided on the upper surface of the frame.

15. The clamp of claim 11 wherein any surfaces of the jaws and frame that face the aperture through the frame have been treated with a finish to increase the coefficient of friction.

16. The clamp of claim 11 further comprising a set screw for adjusting the spring force of the first spring.

17. The clamp of claim 11 wherein the first spring includes at least one limit post for limiting the spring force of the first spring.

* * * * *